US008730731B2

(12) United States Patent
Kim et al.

(10) Patent No.: US 8,730,731 B2
(45) Date of Patent: May 20, 2014

(54) SEMICONDUCTOR MEMORY DEVICE FOR COMPENSATING FOR OPERATING VOLTAGE DIFFERENCE BETWEEN NEAR CELL AND FAR CELL IN CONSIDERATION OF CELL POSITION, AND MEMORY CARD AND MEMORY SYSTEM INCLUDING THE SAME

(75) Inventors: Ho Jung Kim, Suwon-si (KR); Young Sun Song, Hwasung-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 470 days.

(21) Appl. No.: 12/687,949

(22) Filed: Jan. 15, 2010

(65) Prior Publication Data
US 2010/0182866 A1 Jul. 22, 2010

(30) Foreign Application Priority Data

Jan. 16, 2009 (KR) .................. 10-2009-0003688

(51) Int. Cl.
*G11C 11/34* (2006.01)
(52) U.S. Cl.
USPC .................................................. 365/185.13
(58) Field of Classification Search
USPC ........................................ 365/185.13, 189.09
See application file for complete search history.

(56) References Cited

U.S. PATENT DOCUMENTS

| 5,717,636 A * | 2/1998 | Dallabora et al. ........ 365/185.13 |
| 5,748,528 A * | 5/1998 | Campardo et al. ........ 365/185.13 |
| 5,798,966 A * | 8/1998 | Keeney ..................... 365/185.18 |
| 5,808,954 A * | 9/1998 | Ichikawa ..................... 365/226 |
| 2003/0107092 A1* | 6/2003 | Chevallier ..................... 257/390 |
| 2009/0003048 A1* | 1/2009 | Ro et al. ........................ 365/163 |
| 2010/0020618 A1* | 1/2010 | Kim et al. ................ 365/185.23 |

FOREIGN PATENT DOCUMENTS

| JP | 2007-080424 A | 3/2007 |
| KR | 10-2000-0027817 A | 5/2000 |
| KR | 10-2006-0056687 A | 5/2006 |

* cited by examiner

*Primary Examiner* — Vanthu Nguyen
*Assistant Examiner* — Khamdan Alrobaie
(74) *Attorney, Agent, or Firm* — Sughrue Mion, PLLC (57) ABSTRACT

A semiconductor memory device is provided. The semiconductor memory device includes a memory cell array including a matrix of memory cells; a plurality of local bit lines divided into at least two local bit line groups arranged to be alternately connected with at least two global bit lines and coupled with the memory cells; a plurality of bit line selection drivers respectively connected to the local bit lines; an internal boosted voltage generator configured to generate at least two internal boosted voltages having different levels; and a power transmitter configured to respectively transmit the at least two internal boosted voltages to at least two bit line selection driver groups, into which the plurality of bit line selection drivers are classified according to arrangement of the local bit lines. Accordingly, repair efficiency can be increased and near-far compensation can be more correctly performed.

8 Claims, 8 Drawing Sheets

SEMICONDUCTOR MEMORY DEVICE FOR COMPENSATING FOR OPERATING VOLTAGE DIFFERENCE BETWEEN NEAR CELL AND FAR CELL IN CONSIDERATION OF CELL POSITION, AND MEMORY CARD AND MEMORY SYSTEM INCLUDING THE SAME

CROSS-REFERENCE TO RELATED APPLICATIONS

This application claims priority from Korean Patent Application No. 10-2009-0003688 filed on Jan. 16, 2009, in the Korean Intellectual Property Office, the disclosure of which is incorporated herein by reference.

BACKGROUND

The present inventive concept relates to a semiconductor memory device, and more particularly, to a semiconductor memory device for compensating for an operating voltage difference between a near cell and a far cell in consideration of a cell position, and a memory card and memory system including the same.

Figure 1:
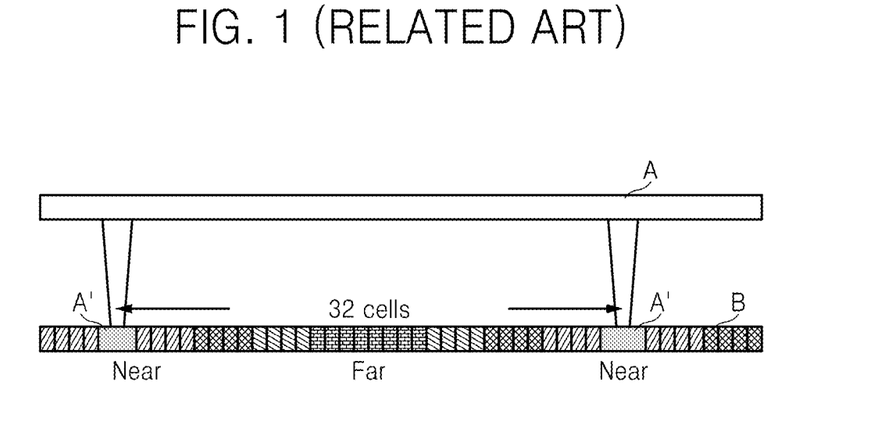
FIG. 1 is a schematic sectional view of a related art semiconductor memory device.

Semiconductor memory devices, as illustrated in FIG. 1, usually write a signal transmitted through a metal A to memory cells in a semiconductor memory B and read data from each memory cell through the metal A. For those operations, the metal A and the semiconductor memory B are connected to each other in a bridge shape. A portion where the metal A is connected with the semiconductor memory B is referred to as a strapping node A'.

A plurality of memory cells may exist between strapping nodes A'. FIG. 1 illustrates a case where 32 memory cells exist between the strapping nodes A'. Each memory cell has a different operating voltage according to a distance from either of the strapping nodes A'. In other words, the farther a memory cell is apart from a strapping node A', the greater operating voltage the memory cell has. Cells close to the strapping node A' are referred to as near cells and cells far from the strapping node A' are referred to as far cells.

There is a need for compensation of an operating voltage difference (hereinafter, refer to as "near-far compensation").

SUMMARY

One or more exemplary embodiments of the present inventive concept provide a semiconductor memory device for increasing repair efficiency and correctly performing near-far compensation.

One or more exemplary embodiments of the present inventive concept also provide a semiconductor memory device for performing near-far compensation in consideration of a real position of a cell regardless of an address.

One or more exemplary embodiments of the present inventive concept also provide a memory card and memory system including the semiconductor memory device.

According to an exemplary embodiment of the present inventive concept, there is provided a semiconductor memory device including a memory cell array including a matrix of memory cells; a plurality of local bit lines divided into at least two local bit line groups which are alternately connected with at least two global bit lines and coupled with the memory cells; a plurality of bit line selection drivers respectively connected to the local bit lines; an internal boosted voltage generator configured to generate at least two internal boosted voltages having different levels; and a power transmitter configured to respectively transmit the at least two internal boosted voltages to at least two bit line selection driver groups, into which the plurality of bit line selection drivers are classified according to arrangement of the local bit lines.

The local bit line groups may include at least one local bit line and may include the same number of local bit lines.

Each of the bit line selection driver groups may include a bit line selection driver connected to a bit line included in each of local bit line groups respectively connected to the different global bit lines.

The power transmitter may include at least two power amplification units each of which outputs one of the at least two internal boosted voltages having different levels to at least two power lines respectively connected to gates of at least two respective bit line selection drivers.

According to another exemplary embodiment of the present inventive concept, there is provided a memory card including a semiconductor memory device comprising a plurality of local bit lines divided into at least two local bit line groups arranged to be alternately connected with at least two global bit lines and a plurality of bit line selection drivers respectively connected to the local bit lines and respectively transmitting different internal boosted voltages to at least two bit line selection driver groups, into which the plurality of bit line selection drivers are classified according to arrangement of the local bit lines; and a memory controller configured to control a program operation and a read operation of the semiconductor memory device.

According to another exemplary embodiment of the present i inventive concept, there is provided a system including a central processing unit configured to control overall operations of the system; a semiconductor memory device configured to store data that has been processed and/or will be processed by the central processing unit, the semiconductor memory device comprising a plurality of local bit lines divided into at least two local bit line groups arranged to be alternately connected with at least two global bit lines and a plurality of bit line selection drivers respectively connected to the local bit lines and respectively transmitting different internal boosted voltages to at least two bit line selection driver groups, into which the plurality of bit line selection drivers are classified according to arrangement of the local bit lines; and a memory controller controlled by the central processing unit to control a program operation and a read operation of the semiconductor memory device.

BRIEF DESCRIPTION OF THE DRAWINGS

The above and other aspects of the present inventive concept will become more apparent by describing in detail exemplary embodiments thereof with reference to the attached drawings in which.

DETAILED DESCRIPTION OF THE EXEMPLARY EMBODIMENTS

Exemplary embodiments will now be described more fully hereinafter with reference to the accompanying drawings. The exemplary embodiments are for illustration purposes and should not be construed as limiting. Rather, the exemplary embodiments are provided so that this disclosure will be thorough and complete, and will fully convey a complete understanding to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular exemplary embodiments only and is not intended to be limiting. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 2:
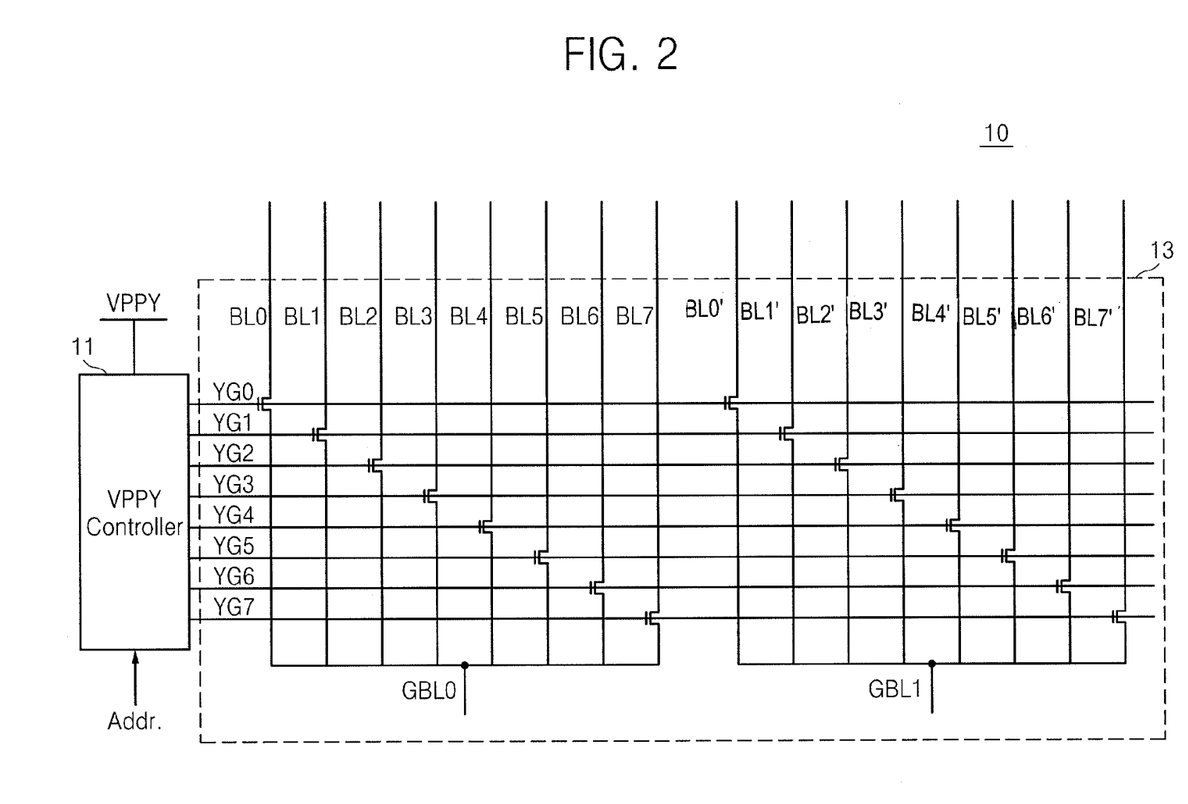
FIG. 2 is a schematic circuit diagram of a semiconductor memory device according to an exemplary embodiment of the present inventive concept.

FIG. 2 is a schematic circuit diagram of a semiconductor memory device according to an exemplary embodiment of the present inventive concept. Referring to FIG. 2, the semiconductor memory device 10 may include a VPPY controller 11 controlling an internal boosted voltage VPPY based on an address and a bit line selector 13 including a plurality of bit line selection drivers referred to as YPASS drivers. Different voltages controlled by the VPPY controller 11 are applied to gates of the respective bit line selection drivers. In detail, a higher voltage is applied to a bit line selection driver connected to a far cell than to a near cell to perform the near-far compensation.

Meanwhile, when semiconductor memory devices have a dead cell, they usually move data in the dead cell to a repair region (e.g., a redundancy cell) to store the data in the repair region to be repaired. However, in a semiconductor memory device that performs the near-far compensation based on address information as described with reference to FIG. 2, repair efficiency decreases, and therefore, accuracy of the near-far compensation is restricted.

Figure 3:
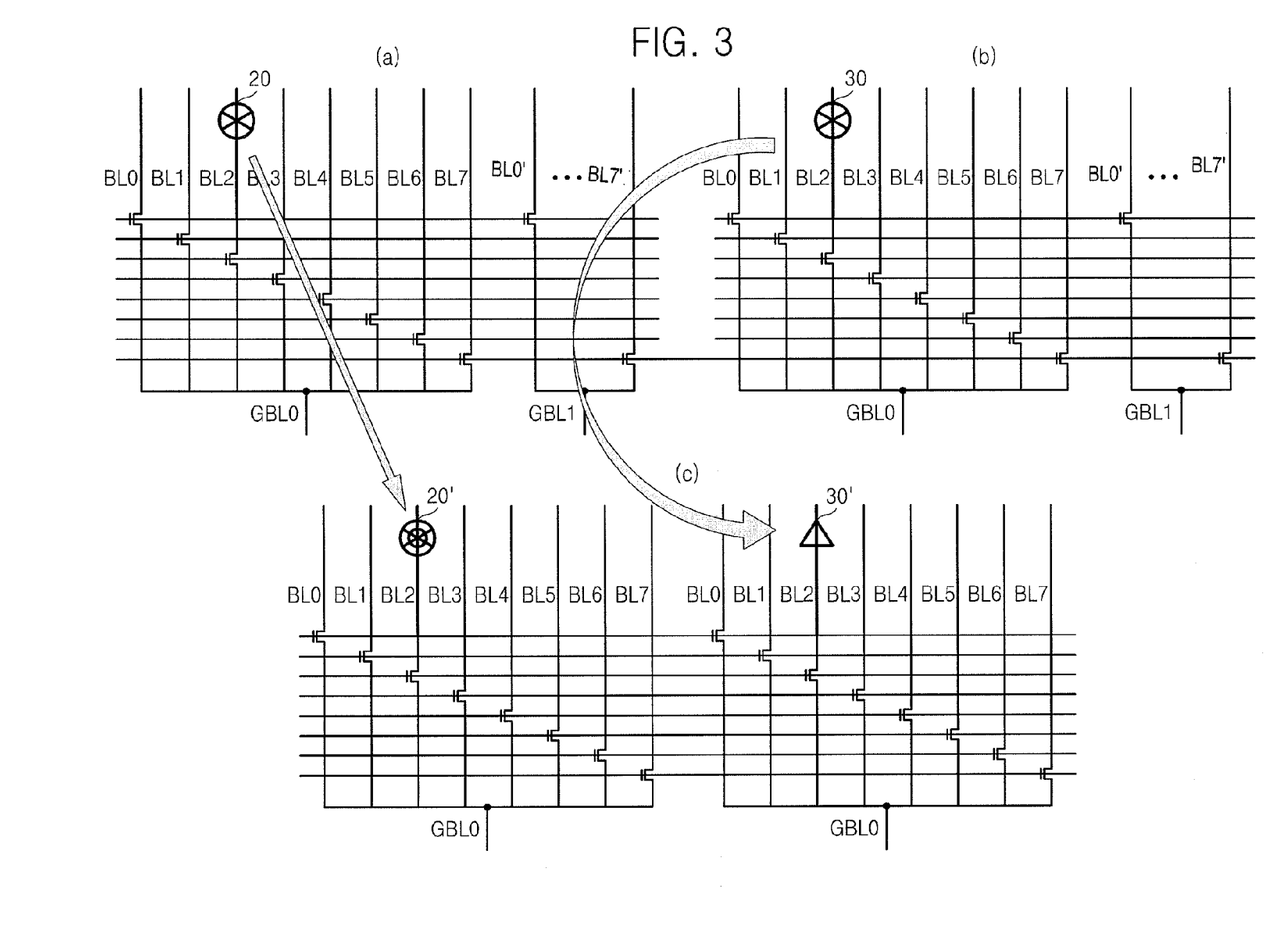
FIG. 3 illustrates a method of repairing a dead cell in a semiconductor memory device according to en exemplary embodiment of the present inventive concept.

FIG. 3 illustrates a method of repairing a dead cell in a semiconductor memory device according to an exemplary embodiment of the present inventive concept. FIG. 3 shows different memory cell arrays (a) and (b) and a repair region (c). When a first dead cell 20 occurs in the memory cell array (a), data stored in the first dead cell 20 is moved to, and stored in, a first redundancy cell 20' in the repair region (c). Thereafter, when a second dead cell 30 occurs in the memory cell array (b), data stored in the second dead cell 30 is moved to and stored in a second redundancy cell 30' in the repair region (c) through a detour since data already exists in the first redundancy cell 20'. At this time, the first and second redundancy cells 20' and 30' storing the repaired data of the first and second dead cells 20 and 30, respectively, are highly likely not to have the same physical conditions as the first and second dead cells 20 and 30. In detail, the first and second dead cells 20 and 30 may be near cells, but the first and second redundancy cells 20' and 30' may be far cells.

Accordingly, when the near-far compensation is performed as in the related art based on address information, the near-far compensation may not be correctly performed on memory cells storing repaired data. For instance, in a case where data in a dead cell which is a near cell is moved to a redundancy cell which is a far cell, if the related art near-far compensation is performed based on address information, an operating voltage for a near cell would be applied to the redundancy cell despite that the data stored in the far cell actually needs to be read.

Figure 4:
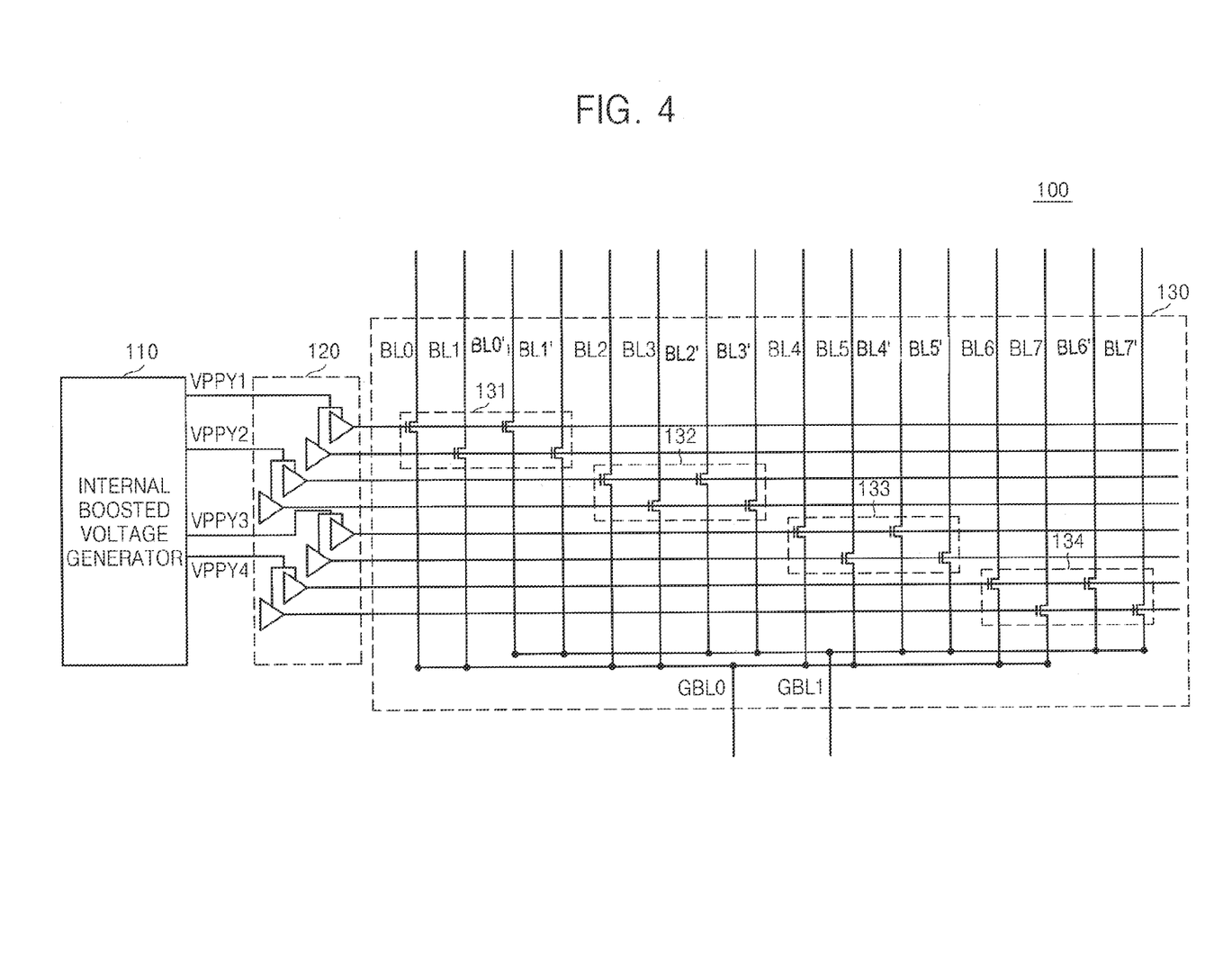
FIG. 4 is a schematic circuit diagram of a semiconductor memory device according to an exemplary embodiment of the present inventive concept.

FIG. 4 is a schematic circuit diagram of a semiconductor memory device 100 according to an exemplary embodiment of the present inventive concept. Referring to FIG. 4, the semiconductor memory device 100 includes a memory cell array (not shown), an internal boosted voltage generator 110, a power transmitter 120, and a bit line selector 130.

The memory cells included in the memory cell array is coupled with a plurality of local bit lines. The local bit lines are divided into at least two local bit line groups which may be alternately connected with at least two global bit lines. The local bit line groups include at least one local bit line and may include the same number of local bit lines.

In the exemplary embodiments illustrated in FIG. 4, eight local bit lines BL0, BL1, . . . , and BL7 are connected to a first global bit line GBL0. Eight local bit lines BL0', BL1', . . . , and BL7' are connected to a second global bit line GBL1. Each local bit line group includes two of the eight local bit lines BL0 through BL7 and BL0' through BL7'. In detail, a first local bit line group includes the first and second local bit lines BL0 and BL1; a first local bit line group includes the first and second local bit lines BL0' and BL1'; a second local bit line group includes the third and fourth local bit lines BL2 and BL3; a second local bit line group includes the third and fourth local bit lines BL2' and BL3'; a third local bit line group includes the fifth and sixth local bit lines BL4 and BL5; a third local bit line group includes the fifth and sixth local bit lines BL4' and BL5'; and a fourth local bit line group includes the seventh and eighth local bit lines BL6 and BL7; and a fourth local bit line group includes the seventh and eighth local bit lines BL6' and BL7'.

Accordingly, in the exemplary embodiments illustrated in FIG. 4, bit lines are arranged in order of the first local bit line group (BL0 and BL1) connected to the first global bit line GBL0, the first local bit line group (BL0' and BL1') connected to the second global bit line GBL1, the second local bit line group (BL2 and BL3) connected to the first global bit line GBL0, the second local bit line group (BL2' and BL3') connected to the second global bit line GBL1, the third local bit line group (BL4 and BL5) connected to the first global bit line GBL0, the third local bit line group (BL4' and BL5') connected to the second global bit line GBL1, the fourth local bit line group (BL6 and BL7) connected to the first global bit line GBL0, and the fourth local bit line group (BL6' and BL7') connected to the second global bit line GBL1.

The bit line selector 130 selects a column of memory cells included in the memory cell array based on an internal boosted voltage. For this operation, the bit line selector 130 includes a plurality of bit line selection drivers connected to the local bit lines, respectively.

The internal boosted voltage generator 110 generates at least two internal boosted voltages VPPY having different levels. In the exemplary embodiments illustrated in FIG. 4, the internal boosted voltage generator 110 generates four internal boosted voltages VPPY1, VPPY2, VPPY3, and VPPY4 having different levels.

The power transmitter 120 transmits the internal boosted voltages generated by the internal boosted voltage generator 110 to the bit line selector 130. In particular, the power transmitter 120 transmits at least two internal boosted voltages having different levels to at least two bit line selection driver groups, respectively, into which the plurality of bit line selection drivers are divided into according to the arrangement of the local bit lines. At this time, each bit line selection driver group may include a bit line selection driver connected to a bit line included in each of local bit line groups respectively connected to different global bit lines.

In the exemplary embodiment illustrated in FIG. 4, four bit line selection drivers respectively connected to the local bit lines BL0 and BL1 of the first local bit line group connected to the first global bit line GBL0 and the local bit lines BL0' and BL1' of the first local bit line group connected to the second global bit line GBL1 are classified into a first bit line selection driver group 131. Four bit line selection drivers respectively connected to the local bit lines BL2 and BL3 of the second local bit line group connected to the first global bit line GBL0 and the local bit lines BL2' and BL3' of the second local bit line group connected to the second global bit line GBL1 are classified into a second bit line selection driver group 132. Four bit line selection drivers respectively connected to the local bit lines BL4 and BL5 of the third local bit line group connected to the first global bit line GBL0 and the local bit lines BL4' and BL5' of the third local bit line group connected to the second global bit line GBL1 are classified into a third bit line selection driver group 133. Four bit line selection drivers respectively connected to the local bit lines BL6 and BL7 of the fourth local bit line group connected to the first global bit line GBL0 and the local bit lines BL6' and BL7' of the fourth local bit line group connected to the second global bit line GBL1 are classified into a fourth bit line selection driver group 134.

The power transmitter 120 transmits internal boosted voltages having different levels to bit line selection driver groups, respectively. In the exemplary embodiments illustrated in FIG. 4, the power transmitter 120 transmits the first through fourth internal boosted voltages VPPY1 through VPPY4 to the first through fourth bit line selection driver groups 131 through 134, respectively.

The power transmitter 120 may include at least two power amplification units each of which outputs one of at least two internal boosted voltages having different levels, generated by the internal boosted voltage generator 110, to at least two power lines respectively connected to gates of at least two respective bit line selection drivers. In the exemplary embodiments illustrated in FIG. 4, the power transmitter 120 includes four power amplification units each of which outputs one of the internal boosted voltages VPPY1 through VPPY4 to two power lines respectively connected to gates of two respective bit line selection drivers.

Figure 5:
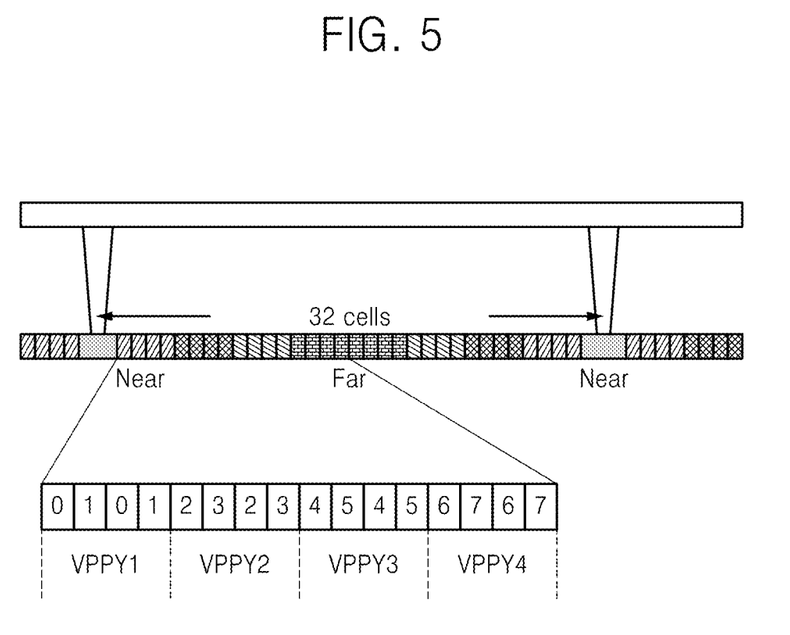
FIG. 5 is a diagram illustrating a method of compensating for an operating voltage difference between a near cell and a far cell using a semiconductor memory device according to an exemplary embodiment of the present inventive concept.

FIG. 5 is a diagram illustrating a method of compensating for an operating voltage difference between a near cell and a far cell using a semiconductor memory device according to an exemplary embodiment of the present inventive concept. According to the exemplary embodiment of the present inventive concept, the semiconductor memory device applies different internal boosted voltages VPPY1 through VPPY4 to cells according to the positions of the cells to perform near-far compensation, instead of controlling an internal boosted voltage per memory cells at the same address. Accordingly, the semiconductor memory device can correctly perform the near-far compensation with respect to memory cells storing repaired data. In detail, the semiconductor memory device applies an internal boosted voltage to a redundancy cell based on position information of the redundancy cell instead of address information of a dead cell, thereby correctly performing the near-far compensation.

The semiconductor memory device according to the exemplary embodiments of the present inventive concept may be combined with a memory controller controlling the semiconductor memory device, thereby forming a memory card. At this time, the memory controller may be configured to communicate with an external device (e.g., a host) using one of various interface protocols such as a Universal Serial Bus (USB) protocol, a multimedia card (MMC) protocol, a Peripheral Component Interconnection Express (PCI-E) protocol, a Serial Advanced Technology Attachment (SATA) protocol, a parallel ATA (PATA) protocol, a Small Computer System Interface (SCSI) protocol, an Enhanced Small Disk Interface (ESDI) protocol, and an Integrated Drive Electronics (IDE) protocol.

Figure 6:
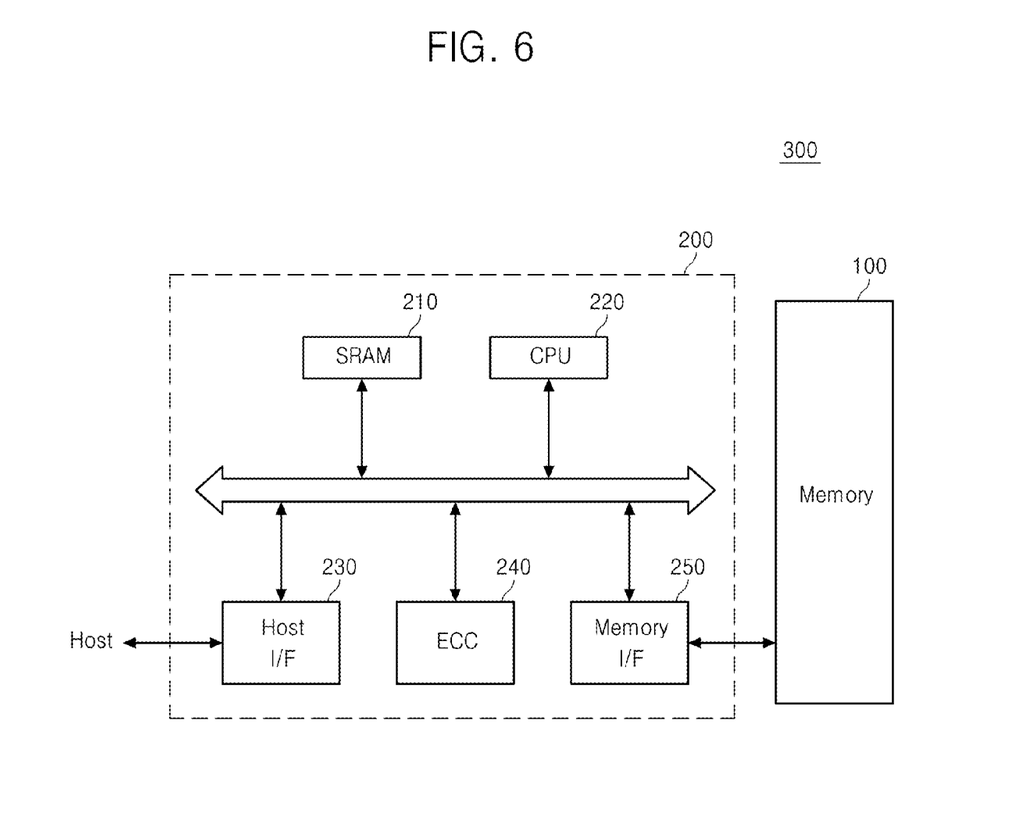
FIG. 6 is a schematic block diagram of a memory card including a semiconductor memory device according to an exemplary embodiment of the present inventive concept.

FIG. 6 is a schematic block diagram of a memory card 300 including the semiconductor memory device 100 (hereinafter, referred to as the memory 100) according to an exemplary embodiment of the present inventive concept. The memory card 300 includes a memory controller 200 controlling general data communication between a host and the memory 100. The memory 100 includes a plurality of local bit lines divided into at least two local bit line groups arranged to be alternately connected with at least two global bit lines and a plurality of bit line selection drivers respectively connected to the local bit lines and respectively applies different internal boosted voltages to at least two bit line selection driver groups into which the bit line selection drivers are classified according to the arrangement of the local bit lines.

The memory controller 200 may include a static random access memory (SRAM) 210, a central processing unit (CPU) 220, a host interface (I/F) 230, an error correction code (ECC) unit 240, and a memory I/F 250. The SRAM 210 is used as an operating memory for the CPU 220. The host I/F 230 is equipped with a data communication protocol of the host connected with the memory card 300. The ECC unit 240 may detect and correct an error bit(s) included in the data read from the memory 100. The memory I/F 250 interfaces with the memory 100. The CPU 220 performs general control operations to write data to and/or read data from the memory 100. Although not shown, it would be apparent to those of ordinary skill in the art that the memory card 300 may also include read-only memory (not shown) which stores code data used for interface with the host.

Figure 7:
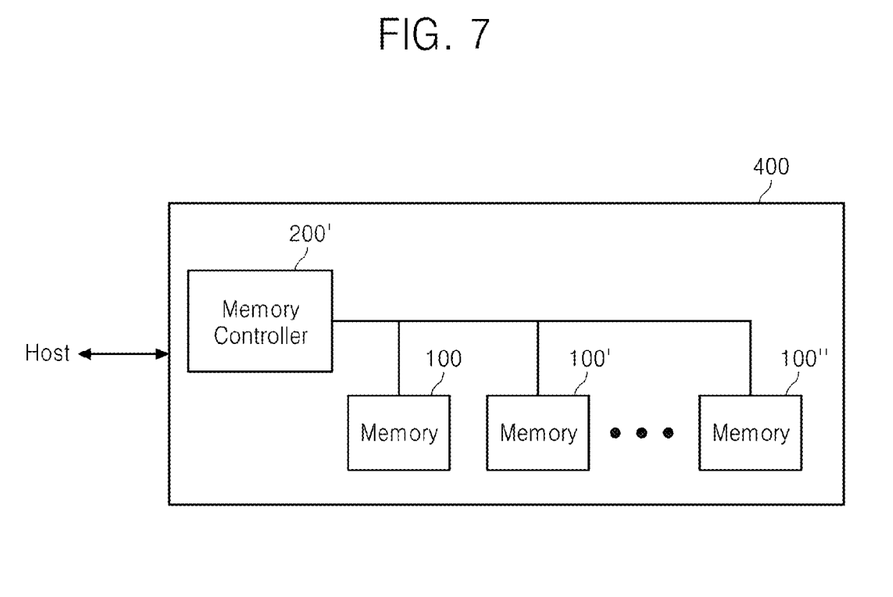
FIG. 7 is a schematic block diagram of a memory card including a semiconductor memory device according to an exemplary embodiment of the present inventive concept.

In the memory card 300 of FIG. 6, the memory controller 200 is configured to control a single memory 100, that is the memory 100, a memory card 400 including one or more memories may be configured as illustrated in FIG. 7. That is, referring to FIG. 7, a memory controller 200' may control one or more memories 100, 100', . . . , 100" connected in parallel.

Figure 8:
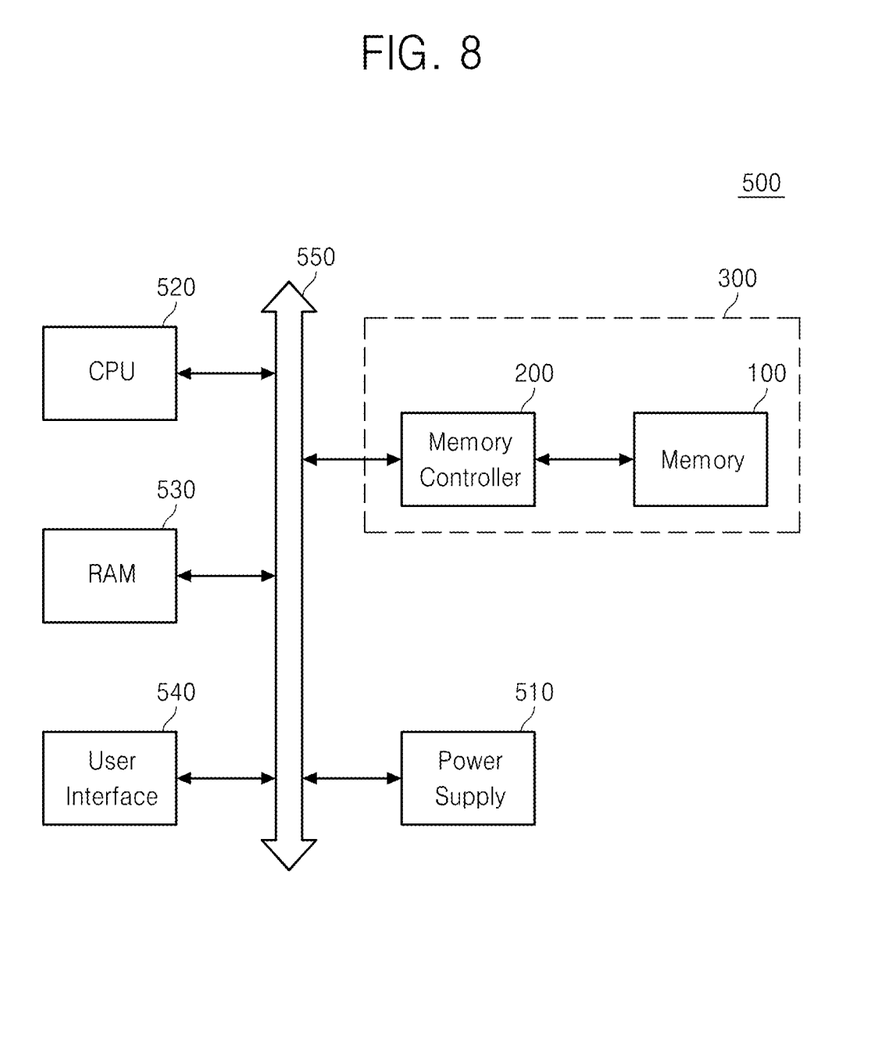
FIG. 8 is a block diagram of an electronic system including a semiconductor memory device according to an exemplary embodiment of the present inventive concept.

The semiconductor memory device according to an exemplary embodiment of the inventive concept may be installed at a computing system, for example, systems such as mobile devices or desktop computers, of which an example is illustrated in FIG. 8. FIG. 8 is a block diagram of a system 500 having a semiconductor memory device according to an exemplary embodiment of the inventive concept. Referring to FIG. 8, the system 500 with a semiconductor memory device includes the memory card 300 having the memory 100 and the memory controller 200, a power supply 510, a CPU 520, a RAM 530, a user interface 540, which are electrically connected in a system bus 550.

The CPU 520 controls the overall operation of the system 500. The RAM 530 stores information needed for the operation of the system 500. The user interface 540 provides interface between the system 500 and a user. The memory 100 may be configured to be substantially the same as the semiconductor memory device described in FIG. 4. The memory 100 stores data that is provided through the user interface 540 or processed or will be processed by the CPU 520, via the memory controller 200. In particular, the memory 100 including a plurality of local bit lines divided into at least two local bit line groups arranged to be alternately connected with at least two global bit lines and a plurality of bit line selection drivers respectively connected to the local bit lines and respectively transmitting different internal boosted voltages to at least two bit line selection driver groups, into which the plurality of bit line selection drivers are classified according to arrangement of the local bit lines. The memory controller 200 controls the programming and reading operations of the memory 100.

Although in FIG. 8 the memory 100 and the memory controller 200 together constitute a single memory card, that is, the memory card 300, the memory 100 and the memory controller 200 may be separately configured. Although it is not illustrated in the drawings, the system may be further provided with application chipsets, camera image processors (CISs), or mobile DRAMs, which is well known to one skilled in the art to which the present inventive concept pertains.

As described above, according to some exemplary embodiments of the present inventive concept, a semiconductor memory device applies an internal boosted voltage to a cell based on position information of the cell instead of address information of the cell, thereby correctly performing near-far compensation with respect even to memory cells storing repaired data.

While the present inventive concept has been particularly shown and described with reference to exemplary embodiments thereof, it will be understood by those of ordinary skill in the art that various changes in forms and details may be made therein without departing from the spirit and scope of the present inventive concept as defined by the following claims.

What is claimed is:

1. A semiconductor memory device comprising:
a memory cell array including a matrix of memory cells;
a plurality of local bit lines divided into a plurality of local bit line groups in which the plurality of local bit line groups are alternatively connected with at least two global bit lines and coupled with the memory cells;
a plurality of bit line selection drivers respectively connected to the local bit lines;
an internal boosted voltage generator which generates at least two internal boosted voltages having different levels; and
a power transmitter which respectively transmits the at least two internal boosted voltages to a plurality of bit line selection driver groups, into which the plurality of bit line selection drivers are classified according to an arrangement of the local bit lines, wherein at least one of the at least two internal boosted voltages is transmitted according to positions of the memory cells to at least two bit line selection driver groups which correspond to at least two local bit line groups,
wherein the at least two local bit line groups include at least one bit line group including at least two bit lines sequentially arranged with another of the at least one bit line group, such that the at least one bit line group including at least two bit lines is connected to a first global bit line of the at least two global bit lines and the another at least one bit line group is connected to a second global bit line of the at least two global bit lines, and the first global bit line is a different line from the second global bit line.

2. The semiconductor memory device of claim 1, wherein the at least two local bit line groups comprise a same number of local bit lines.

3. The semiconductor memory device of claim 1, wherein each of the bit line selection driver groups comprises a bit line selection driver connected to a bit line included in each of local bit line groups respectively connected to the different global bit lines.

4. The semiconductor memory device of claim 1, wherein the power transmitter comprises at least two power amplification units each of which outputs one of the at least two internal boosted voltages having different levels to at least two power lines respectively connected to gates of at least two respective bit line selection drivers.

5. A memory card comprising:
the semiconductor memory device of claim 1; and
a memory controller configured to control a program operation and a read operation of the semiconductor memory device.

6. The semiconductor memory device of claim 1, wherein the power transmitter transmitting the at least two internal boosted voltages to the at least two bit line selection driver groups according to a position of the memory cells compensates for memory cells storing repaired data.

7. A system for compensating for operating voltage differences between a near cell and a far cell in a semiconductor memory, the system comprising:
a central processing unit which controls overall operation of the system;
a semiconductor memory device which stores data that has been processed and/or will be processed by the central processing unit,
the semiconductor memory device comprising a plurality of local bit lines divided into a plurality of local bit line groups in which the plurality of local bit line groups are arranged to be alternatively connected with at least two global bit lines and a plurality of bit line selection drivers respectively connected to the local bit lines and respectively transmitting different internal boosted voltages to a plurality of bit line selection driver groups, into which the plurality of bit line selection drivers are classified according to an arrangement of the local bit lines, wherein at least one of the different internal boosted voltages is transmitted according to positions of the memory cells to at least two bit line selection driver groups which correspond to at least two local bit line groups; and a memory controller controlled by the central processing unit to control a program operation and a read operation of the semiconductor memory device, wherein the at least two local bit line groups include at least one bit line group including at least two bit lines sequentially arranged with another of the at least one bit line group, such that the at least one bit line group including at least two bit lines is connected to a first global bit line of the at least two global bit lines and the another at least one bit line group is connected to a second global bit line of the at least two global bit lines, and the first global bit line is a different line from the second global bit line.

8. A semiconductor memory device comprising:

a memory cell array including a matrix of memory cells;

a plurality of local bit lines divided into a plurality of local bit line groups in which the plurality of local bit line groups are alternatively connected with at least two global bit lines;

a plurality of bit line selection drivers;

an internal boosted voltage generator which generates at least two internal boosted voltages of different levels, and a power transmitter which transmits the at least two internal boosted voltages to a plurality of bit line selection driver groups, wherein at least one of the at least two internal boosted voltages is transmitted according to positions of the memory cells to at least two bit line selection driver groups which correspond to at least two local bit line groups, wherein the at least two local bit line groups include at least one bit line group including at least two bit lines sequentially arranged with another of the at least one bit line group, such that the at least one bit line group including at least two bit lines is connected to a first global bit line of the at least two global bit lines and the another at least one bit line group is connected to a second global bit line of the at least two global bit lines, and the first global bit line is a different line from the second global bit line.

* * * * *